United States Patent [19]

Ishikawa et al.

[11] Patent Number: 4,567,646
[45] Date of Patent: Feb. 4, 1986

[54] METHOD FOR FABRICATING A DIELECTRIC ISOLATED INTEGRATED CIRCUIT DEVICE

[75] Inventors: Tamotsu Ishikawa, Yokohama; Hirokazu Tanaka, Kawasaki; Akira Tabata, Zama, all of Japan

[73] Assignee: Fujitsu Limited, Kanagawa, Japan

[21] Appl. No.: 676,988

[22] Filed: Nov. 30, 1984

[30] Foreign Application Priority Data

Nov. 30, 1983 [JP] Japan ................................ 58-227263
Nov. 30, 1983 [JP] Japan ................................ 58-227262

[51] Int. Cl.$^4$ .................... H01L 21/302; H01L 21/76
[52] U.S. Cl. .............................. 29/576 W; 29/576 E; 29/578; 29/580; 148/174; 148/175; 148/DIG. 85; 148/DIG. 122; 148/DIG. 26; 156/647; 156/649; 156/653; 156/657; 357/49; 357/50
[58] Field of Search ................ 29/576 W, 576 E, 578, 29/580; 148/174, 175, DIG. 85, DIG. 122, DIG. 26; 156/647, 649, 653, 657; 357/49, 50

[56] References Cited

U.S. PATENT DOCUMENTS

| | | | |
|---|---|---|---|
| 3,423,823 | 1/1969 | Ansley | 29/578 |
| 3,440,498 | 4/1969 | Mitchell | 148/DIG. 85 |
| 3,471,922 | 10/1969 | Legat et al. | 29/580 |
| 3,607,466 | 9/1971 | Miyazaki | 148/174 X |
| 3,826,699 | 7/1974 | Sawazaki et al. | 148/175 |
| 3,829,889 | 8/1974 | Allison et al. | 357/49 |
| 3,911,559 | 10/1975 | Bean et al. | 29/578 |
| 3,956,034 | 5/1976 | Nicolay | 148/175 |

OTHER PUBLICATIONS

Anantha et al., "High-Voltage Power Transistors", I.B.M. Tech. Discl. Bull., vol. 16, No. 9, Feb. 1974, pp. 2874–2875.

*Primary Examiner*—William G. Saba
*Attorney, Agent, or Firm*—Armstrong, Nikaido, Marmelstein & Kubovcik

[57] ABSTRACT

A method for fabricating a wafer for a dielectric isolation (DI) integrated circuit device is provided, wherein the substrate of the wafer, comprises portions of polycrystalline silicon positioned beneath regions for electrical elements, namely, "islands", and portions of single crystal silicon are positioned in other areas of the wafer such as scribing regions, peripheral regions and contact regions. The single crystal portions of the substrate are grown during its fabricating steps by exposing surfaces of an original substrate of single crystal silicon, before the deposition of silicon onto the original substrate, by removing a dielectric isolation layer over the predetermined regions to be exposed. The single crystal silicon portions of the wafer provide various advantages for subsequent mechanical processing of the wafer such as shaping and rounding of the peripheral region and the scribing of the wafer into dice.

4 Claims, 18 Drawing Figures

METHOD FOR FABRICATING A DIELECTRIC ISOLATED INTEGRATED CIRCUIT DEVICE

BACKGROUND OF THE INVENTION

1. Field of the Invention

The present invention relates to a method for fabricating a dielectric isolated (DI) integrated circuit (IC) device. It relates more particularly to a method for fabricating an improved DI substrate to remove the inherent drawbacks associated with its fabricating process.

2. Description of the Prior Art

The use of dielectric isolation (DI) instead of pnjunction isolation in the fabrication of IC devices has become progressively widespread for special fields. Due to its reduced parasitic capacitance and very high interdevice breakdown voltage, the DI IC devices are widely used for apparatus where breakdown damage might occur, such as a switching device for a subscriber line interface circuit (SLIC) of an electronic telephone exchanger.

Dielectric isolation is a method for fabricating ICs in which circuit components are isolated by dielectric layers. FIG. 1 is a partial cross-sectional view of a prior art DI semiconductor substrate. There are electrical element regions 7 or "islands", isolated from each other and from a substrate 6 by individual dielectric layers 4, usually a silicon dioxide ($SiO_2$) layer. The substrate 6 has a thickness sufficient to support the islands, thus, ensuring mechanical strength. The prior art fabrication of a DI wafer begins with preparing a one conductivity type doped single crystal silicon substrate (original silicon substrate), followed by formation of insulating moats 3 on the surface for the islands 7. Subsequently, a dielectric layer, such as $SiO_2$ layer 4, is formed covering the entire surface of the wafer, over which silicon is deposited by a conventional chemical vapor deposition (CVD) method using a silicon halide-hydrogen reduction process, to form a layer of a predetermined thickness. The deposited silicon layer is grown at a high temperature such as 1100° C. to form a polycrystalline silicon (polysilicon) layer. Then the wafer is inverted and the original single crystal silicon layer is ground to reveal the DI layers 4 for islands 7. Finally, the front surface of the wafer is finished to a non-defect smooth surface and readied for further fabrication of electrical circuits thereon. (The above process can be understood more easily by observing FIG. 1 upside down. FIG. 1 shows a substrate after the above processes are completed.)

Usually, each island 7 accommodates a circuit element such as a transistor and a film resistor. The island contains a one conductivity type single crystal silicon layer where the circuit element is formed. A heavily doped layer 5 is included to reduce the saturation resistance of the collector of a transistor formed in the island 7.

There are substantial problems in the fabrication of the DI substrate. One of them is a "bow" phenomenon which is warpage or curvature of the multi-layer structure of the wafer after the formation of the polysilicon substrate layer 6 onto the dielectric layer covering the original silicon substrate. There is a difference in the coefficient of expansion between single crystal silicon and polysilicon. The polysilicon layer is grown at a high temperature and the wafer is cooled to room temperature, causing stress inside the wafer to cause "bow".

Other problems occur when humps or projections of the coarse structure of polysilicon, formed in the peripheral edge of the wafer, are removed mechanically. Broken, tiny pieces of polysilicon cause mechanical damage to the surface of the wafer during the surface grinding process, thus, reducing wafer yield. Furthermore, channels for scribing formed on the DI wafer are covered with the dielectric layer like other island areas. Accordingly, scribing cutters are easily abraded by cutting the hard dielectric layer. The above problems are all associated with the described prior art method for fabricating a DI substrate.

SUMMARY OF THE INVENTION

It is an object of the present invention to provide an improved method for fabricating a dielectric isolated (DI) IC device.

It is another object of the present invention to provide a method for fabricating a DI substrate which is effective to raise the fabrication yield and reduce the fabricating cost of the DI substrate.

As stated above, a prior art DI substrate has problems in its fabricating process, and it can be understood for those skilled in the art that these problems are caused by the polysilicon substrate 6. Therefore, the formation of polysilicon structure for the substrate is not desirable. However, as long as the silicon deposition for forming the substrate is performed onto a dielectric layer, the formation of the polysilicon structure is inevitable. A single crystal silicon structure is only attained by depositing silicon onto an exposed single crystal silicon surface. The dielectric layer is indispensable in the island area, an area for mounting circuit elements, but not necessary for other areas such as scribing channel areas, peripheral areas, including the edge portion of the wafer and a contact area for the substrate.

Thus, the idea has been developed wherein for the regions except the island regions, the formation of the dielectric layer is prevented using conventional masking technology, leaving exposed surfaces of the original single crystal silicon surface. For example, areas for scribing channels, peripheral areas of the wafer and a contact area for the polysilicon substrate are selectively prevented from the formation of the dielectric layer thus exposing the original single crystal silicon surface. As a result, single crystal silicon layers are formed selectively and partially over those areas described above, among the polysilicon layer.

With the thus formed DI substrate, the problems described above can be removed or at least reduced. The effect of mismatching of the coefficient of expansion of the single crystal silicon and polysilicon is limited to within each die which is much smaller than the whole wafer, resulting in a reduction of the "bow" phenomenon, or warpage of the wafer.

During the mechanical processing such as grinding, for shaping or rounding the peripheral area or edge of the wafer, generation of destructive polysilicon particles is reduced, because the machining is done to a portion of single crystal silicon. Further, when the wafer is scribed into a number of dice, the wafer can be cut easily at predetermined scribing regions (channels), since abrasive dielectric layer such as silicon dioxide does not exist therein and harmful polysilicon particles are not generated. This results in reducing the wear of scribing cutters. Furthermore, the single crystal silicon is easily scribed along its cleavage plane, providing the die with a smoother side wall than is found with scribing a polysilicon substrate.

This method is also applicable to form a contact for the polysilicon substrate, on the front surface of the die, enabling easy wiring of the substrate to a fixed potential. The embodiments of the present invention will be disclosed referring to the accompanying drawings.

BRIEF DESCRIPTION OF THE DRAWINGS

FIG. 2 is a perspective view, including a partial cross-section, of a DI wafer according to the present invention.

FIG. 3 is a cross-sectional view of the DI wafer after the formation of a thin silicon dioxide layer and silicon nitride layer over a single crystal substrate.

FIG. 4 is a cross-sectional view of the DI wafer after the formation of isolation moats.

FIG. 5 is a cross-sectional view of the DI wafer after the formation of heavily doped regions in the original single crystal silicon substrate.

FIG. 6 is a cross-sectional view of the DI wafer after the formation of a thick silicon dioxide layer for isolation.

FIG. 7 is a cross-sectional view of the DI wafer after the removal of the thin silicon dioxide layer positioned at areas which are to be scribing regions.

FIG. 8 is a cross-sectional view of the DI wafer after depositing silicon onto the inverted device to form a substrate comprising polysilicon portions and single crystal portions.

FIG. 9 is a cross-sectional view of the DI wafer right side up after grinding off the original single crystal silicon substrate to reveal islands.

FIG. 10 is a cross-sectional view of the DI wafer after the formation of circuit elements on the wafer.

FIG. 11 is a cross-sectional view of the DI wafer after the formation of a silicon dioxide layer on an original single crystal silicon substrate.

FIG. 12 is a cross-sectional view of the DI wafer after the formation of isolation moats.

FIG. 13 is a cross-sectional view of the DI wafer after the formation of a thick silicon dioxide layer for isolation.

FIG. 14 is a cross-sectional view of the DI wafer after the formation of a photoresist layer having open windows over the scribing regions.

FIG. 15 is a cross-sectional view of the DI wafer after exposing the surfaces of the original single crystal silicon substrate.

DESCRIPTION OF THE PREFERRED EMBODIMENS

Figure 1:
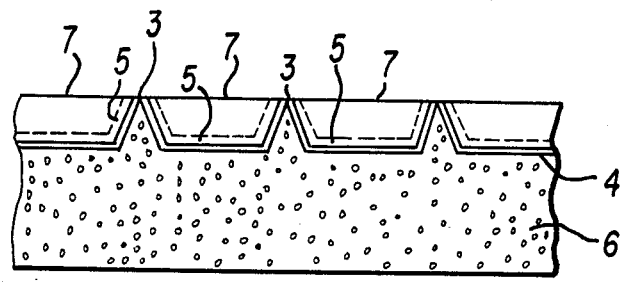
FIG. 1 is a cross-sectional view illustrating the structure of islands in a prior art dielectric isolation (DI) IC device.
Figure 2:
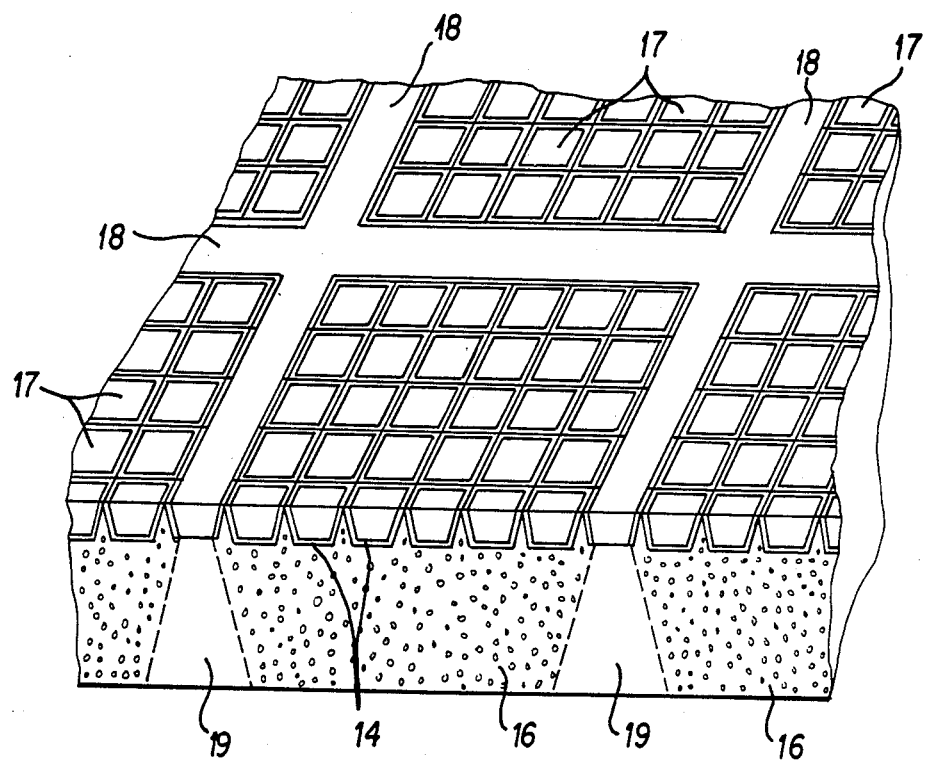
FIGS. 2 to 10 are cross-sectional views of a DI wafer for illustrating an embodiment of the present invention, and showing the structure at respective fabricating steps.
Figure 3:
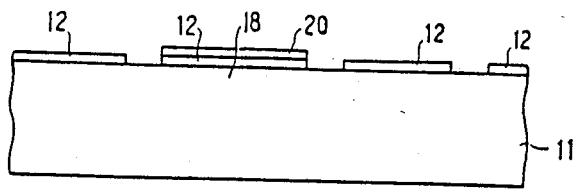

FIG. 2 is a perspective view of a portion of a DI wafer fabricated by a method according to the present invention, illustrating a partial cross-section. It should be noted that selectively formed single crystal silicon layers 19 are formed inside a polysilicon substrate 16 beneath scribing channels 18.

Figure 4:
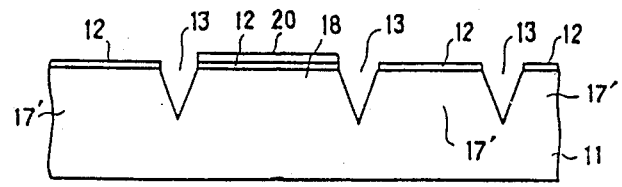
Figure 5:
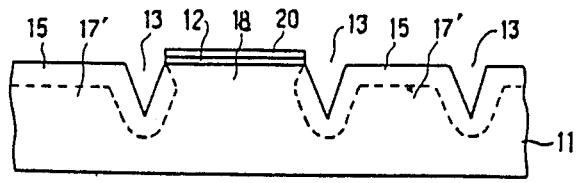
Figure 6:
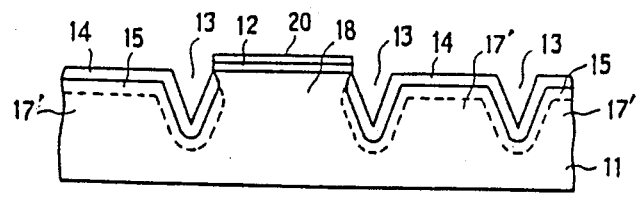
Figure 7:
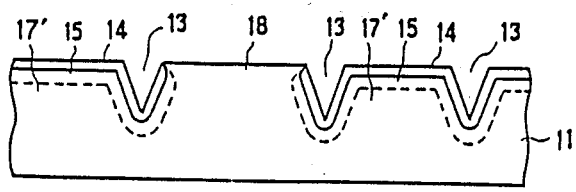

The fabrication steps of the DI substrate according to the present invention are disclosed with reference to respective partial cross-sectional views of the wafer, illustrated in drawings from FIGS. 3 to 10. A one conductivity type, n-type doped, for instance, single crystal silicon wafer 11 is prepared, followed by a subsequent step for forming silicon dioxide ($SiO_2$) layer 12 over the surface of the wafer 11, leaving windows for isolating moats 13 as shown in FIG. 4, by the use of a conventional lithographic technology. The isolation moats 13 define the island areas as will be seen below. After that, silicon nitride ($Si_3N_4$) layer 20 is formed selectively over the portion of $SiO_2$ layer 12 corresponding to the scribing region 18 by a conventional method. Next, the isolation moats 13 are created with an anisotropic etching method through the windows providing the moats 13 with a V-shaped cross-section. After removing, by etching, the $SiO_2$ layer 12 except for the portion under the silicon nitride layer 20 by etching, a heavily doped, $n^{30}$ type silicon layer 15 is formed over the entire surface of the wafer by a conventional method as shown in FIG. 5. Following this step, a thermal oxide layer 14 is grown over the entire surface of the wafer except the region covered by the silicon nitride layer 20 as shown in FIG. 6. The thermal oxidation is performed in a pressurized environment of 5 atm, for example. The silicon oxide layer 14 becomes the isolation layer between the single crystal silicon layer 11 and polysilicon layer which is created later. The thickness of the oxide layer 14 is large such as 1.0 $\mu$m or more, while that of the silicon dioxide layer 12 formed at the earlier step is small such as approximately 4000 Å. After removing the silicon nitride layer 20 by etching with phosphoric acid, a controlled etching is applied to the entire surface of the wafer, until the thin oxide layer 12 is completely removed to expose the underlying single crystal silicon surface 18 where a scribing region is to be formed. However, as shown in FIG. 7, the thick oxide layer 14 having a predetermined thickness still remains, covering the area 17' where the islands are to be formed and the surfaces of the isolation moats 13.

Figure 8:
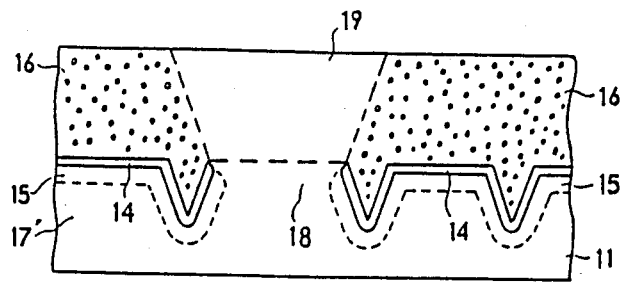
Figure 9:
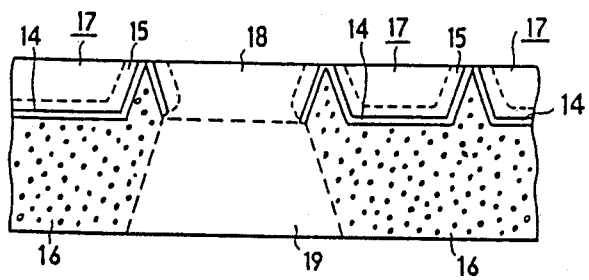

Subsequently, as shown in FIG. 8, a silicon layer is grown over the entire surface of the substrate, comprising the surface of the oxide layer 14 and the exposed single crystal silicon surface 18, utilizing a conventional CVD method, using a silicon halide such as trichlorosilane ($SiHCl_3$) Naturally, a single crystal silicon portion 19 is grown over the surface 18 and polycrystalline silicon portion 16 is grown over the silicon dioxide layer 14. Following the formation of the substrate layer 16 and 19, the device is inverted and the original single crystal silicon layer 11 is ground off mechanically until the silicon dioxide layers 14 covering the side walls of the moats 13 are revealed on the ground surface as shown in FIG. 9. At this step, islands 17 are isolated from each other by each silicon dioxide layer 14 as clearly seen in FIG. 9. Thus, the DI wafer is completed.

Figure 10:
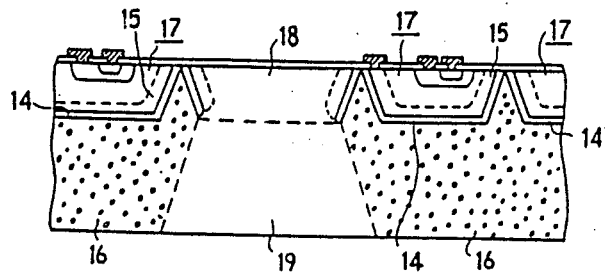

As shown in FIG. 10, utilizing a conventional method, an IC circuit element is created in each island of the completed wafer, and the wafter is divided into dice by scribing at the scribing region 18 comprising the single crystal silicon only. Accordingly, a scribing tool used, usually a diamond cutter, is not as easily damaged as with scribing a prior art wafer. In addition, side walls of each die are smooth since the single crystal silicon is fractured along its cleavage plane.

Figure 11:
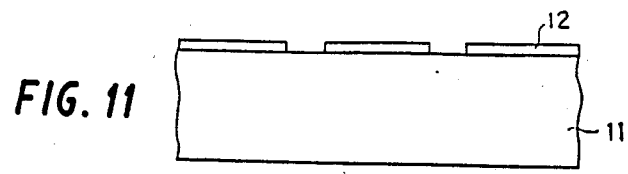
FIGS. 11 to 15 are cross-sectional views illustrating another embodiment of the present invention showing the structure of the wafer at respective fabricating steps.
Figure 12:
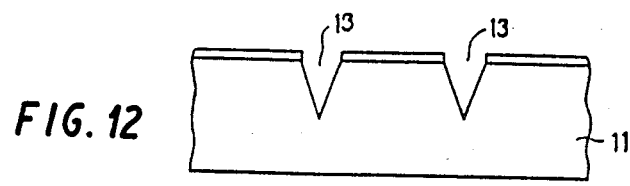
Figure 13:
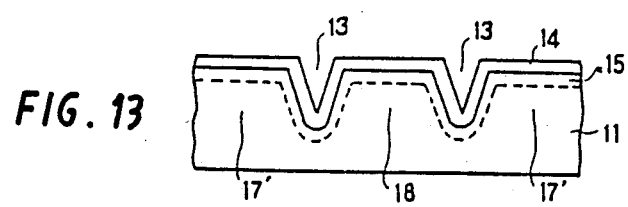
Figure 14:
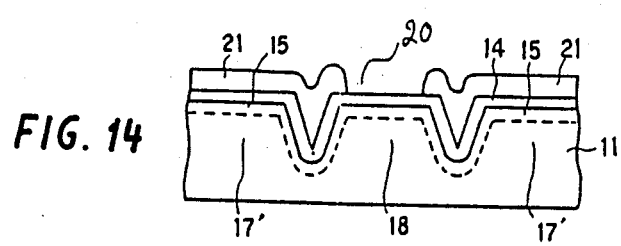
Figure 15:
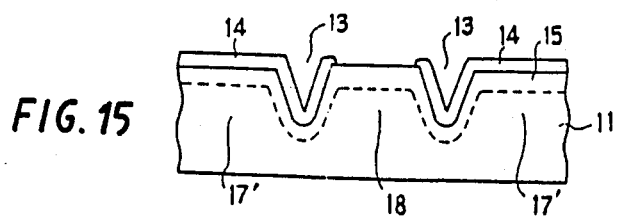

Another embodiment is disclosed with reference to FIGS. 11 to 15. The modification is made in the method for exposing the surface of the original single crystal silicon layer 11, as shown in FIGS. 7 and 14, wherein a photoresist layer 21 is used. A single crystal substrate 11 is masked with a silicon dioxide layer 12 patterned using conventional photolithographic technology, opening windows for the moats 13 as shown in FIG. 11. Isolation moats 13 having a V-shaped cross-section are formed in the same way as that of the former embodiment as shown in FIG. 12, followed by the formation of heavily doped n-type layer 15 and thick oxide layer 14 as shown in FIG. 13. After this step, a photoresist layer 21 is formed over the surface of the oxide layer 14, selectively opening windows 20 for scribing regions using conventional photolithographic technology, as shown in FIG. 14. By etching off the thick oxide layer 14 through the windows 20, the areas where the scribing regions are to be formed, on the surface of the original single crystal silicon substrate 11 are exposed as shown in FIG. 15. After that, the photoresist layer 21 is removed by a chemical etching or dry etching. The subsequent fabricating steps are the same as those in the former embodiment.

Figure 16:
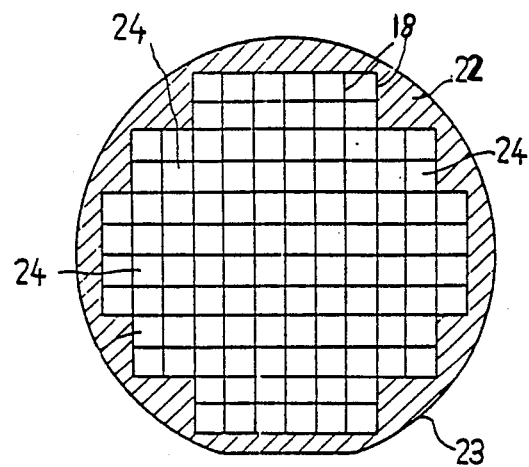
FIG. 16 is a plan view of still another embodiment of the present invention, illustrating a configuration of a peripheral region on a DI wafer.
Figure 17:
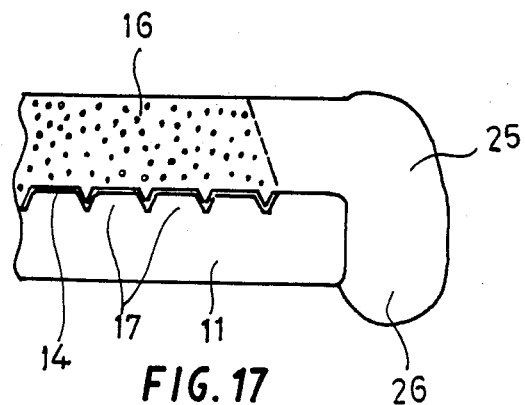
FIG. 17 is a cross-sectional view of the DI wafer after the deposition of silicon onto the original substrate covered by an isolation layer, illustrating a structure of the deposited silicon layer.

The method for forming a single crystal silicon portion in a polysilicon substrate can be applied to a peripheral region 22 of the wafer, which is denoted by hatched areas as seen in the plan view of the wafer of FIG. 16. As illustrated in FIG. 16, the wafer comprises dice 24 and a peripheral region 22. The dice 24 are separated by cutting the wafer at the scribing regions 18. During scribing, the scribing tool such as a cutting grinder is not abraded as easily as in a prior art method, since the material of the scribing region is single crystal silicon. Usually, when a polysilicon layer is formed on the oxide layer 14 as shown in FIG. 17, for example, the polysilicon layer has a lot of humps 25 and projections 26 of coarse grain immediately after its formation by a CVD method. Therefore, it is necessary to shape and round the edge 23 and the peripheral region 22 of the wafer for precise working in the subsequent fabricating steps. In this case, a great number of hard and sharp particles are generated, damaging the surfaces of the wafer with scratches, for example. When the peripheral region 22, including the edge 23 of the wafer is of single crystal silicon, the problem above described is significantly decreased, since the workability of the single crystal silicon is much better than that of polysilicon. Accordingly, it is very advantageous for the fabricating process of a DI wafer to apply the method of this invention to obtain a peripheral region 22 of single crystal silicon.

The "bow" phenomenon described before still exists in the wafer fabricated by the method of this invention, as long as a sandwich structure remains at each island. However, the effect of the difference in the coefficient of expansion between single crystal silicon and polycrystalline silicon is limited to within each island since the scribing regions are of entirely single crystal silicon and no stress occurs inside the regions.

As a result, the total quantity of "bow" or warpage, is significantly reduced as compared with a prior art wafer, thus providing a greater easiness for subsequent machining work of the wafer to obtain precise parallelism of the front and back surfaces of the wafer.

Figure 18:
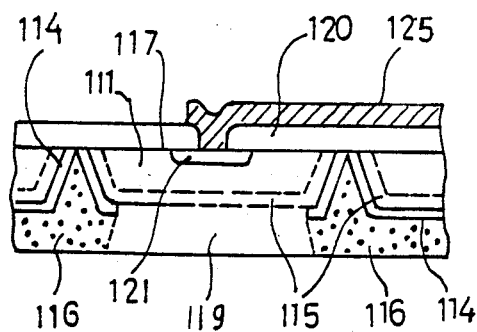
FIG. 18 is a cross-sectional view of a DI wafer having a contact for a polysilicon wafer formed using the method of the present invention.

Furthermore, the present invention is applicable to the formation of a contact with a substrate of a DI IC device, providing the substrate with a fixed electric potential to prevent electrical floating, particularly for a high frequency use. The cross-sectional view of the contact with the substrate is illustrated in FIG. 18. In a substrate of polysilicon 116, islands 117 are formed using a conventional method described above. In this case, one of the islands 117 is modified for contact with the substrate 116. The bottom portion of a dielectric isolation layer 114 is removed to expose a surface of single crystal silicon, before the formation of the polysilicon substrate by a CVD method, and with the aid of the exposed surface of an original single crystal silicon substrate 111, a portion 119 of single crystal silicon is formed in the polysilicon layer 116. The fabrication process will be apparent for those skilled in the art with reference to the preceding description regarding embodiments of the present invention. A heavily doped layer 115 is not necessary, but not harmful, for the contact and it is formed at the same time the doped layers 115 are formed for other islands 117. After the completion of the DI substrate, a silicon dioxide layer 120, $n^+$ type doped contact region 121 and wiring 125 are formed by a conventional method as shown in FIG. 18. In this case, the formation of a wiring 125 can be performed at the same time as the other wirings for circuit elements formed on islands resulting in a saving of fabricating steps.

The many features and advantages of the present invention are apparent from the detailed specification, and thus, it is intended by the appended claims to cover all such features and advantages of the DI integrated circuits which fall within the true spirit and scope of the invention. Further, since numerous modifications and changes will readily occur to those skilled in the art, it is not desired to limit the invention to the exact construction and operations illustrated and described, accordingly, all suitable modifications and equivalents may be restored to, falling within the scope and spirit of the invention.

What is claimed is:

1. A method for fabricating a dielectric isolation (DI) integrated circuit device comprising the steps of:
    (a) preparing a one conductivity type doped single crystal siilcon original substrate having a peripheral region and an interior region;
    (b) forming isolation moates on a surface of said original substrate;
    (c) forming a dielectric isolation layer over a first portion of the interior region of the surface of said original substrate, said first portion of the surface being the areas wherein electrical circuit elements are to be formed;
    (d) exposing said peripheral region of the surface of said original substrate, not including said first portion of the surface; and
    (e) growing a silicon layer over the entire portion of the surface of said original substrate, wherein said grown silicon layer comprises a single crystal silicon over said peripheral region of said surface and a polysilicon over said first portion of said surface.

2. A method for fabricating a dielectric isolation (DI) integrated circuit device of claim 1, wherein said dielectric isolation layer is a silicon dioxide ($SiO_2$) layer.

3. A method of fabricating a dielectric isolation (DI) integrated circuit device as set forth in claim 1, wherein preparing said original substrate comprises the steps of:

(a) forming a silicon dioxide layer on the surface of said original substrate, said silicon dioxide layer having windows at predetermined locations therein;

(b) forming a silicon nitride ($Si_3N_4$) layer on predetermined portions of said silicon dioxide layer; and (c) wherein said moats are formed in the areas beneath the windows in said silicon dioxide layer.

4. A method of fabricating a dielectric isolation (DI) integrated circuit device as set forth in claim 3, wherein exposing said peripheral region of the surface comprises removing said predetermined portions of said silicon dioxide layer and said silicon nitride layer.

* * * * *